United States Patent
Durlam et al.

(10) Patent No.: US 6,174,737 B1
(45) Date of Patent: Jan. 16, 2001

(54) MAGNETIC RANDOM ACCESS MEMORY AND FABRICATING METHOD THEREOF

(75) Inventors: Mark Durlam; Gloria Kerszykowski, both of Chandler; Jon Slaughter, Tempe, all of AZ (US); Theodore Zhu, Plymouth, MN (US); Eugene Chen, Gilbert, AZ (US); Saied N. Tehrani, Tempe, AZ (US); Kelly W. Kyler, Mesa, AZ (US)

(73) Assignee: Motorola, Inc., Schaumburg, IL (US)

( * ) Notice: Under 35 U.S.C. 154(b), the term of this patent shall be extended for 0 days.

(21) Appl. No.: 09/339,460

(22) Filed: Jun. 24, 1999

Related U.S. Application Data

(62) Division of application No. 09/144,686, filed on Aug. 31, 1998, now Pat. No. 5,940,319.

(51) Int. Cl.[7] .................................................. H01L 21/00
(52) U.S. Cl. ........................ 438/3; 438/171; 438/210; 365/171; 365/173
(58) Field of Search ........................... 438/3, 171, 210, 438/266; 365/171, 173

(56) References Cited

U.S. PATENT DOCUMENTS

| | | |
|---|---|---|
| 5,075,247 * 12/1991 | Matthews | 365/171 |
| 5,329,486    7/1994 | Lage | 365/145 |
| 5,352,622 * 10/1994 | Chung | 438/3 |
| 5,424,236 *  6/1995 | Daughton et al. | 438/3 |
| 5,640,343    6/1997 | Gallagher et al. | 365/171 |
| 5,768,181    6/1998 | Zhu et al. | 365/158 |
| 5,861,328 *  1/1999 | Tehrani et al. | 438/210 |
| 6,048,739 *  4/2000 | Hurst et al. | 438/3 |

* cited by examiner

Primary Examiner—Kevin M. Picardat
(74) Attorney, Agent, or Firm—William E. Koch

(57) ABSTRACT

An improved and novel MRAM device with magnetic memory elements and circuitry for controlling magnetic memory elements is provided. The circuitry, for example, transistor (12a) having a gate (17a), a drain (18) and a source (16a) is integrated on a substrate (11) and coupled to a magnetic memory element (43) on the circuitry through a plug conductor (19a) and a conductor line (45). The circuitry is fabricated first under the CMOS process and then magnetic memory elements (43, 44). Digit line (29) and bit line (48) are placed under and on top of magnetic memory element (43), respectively, and enabled to access magnetic memory element (43). These lines are enclosed by a high permeability layer (31, 56, 58) excluding a surface facing magnetic memory element (43), which shields and focuses a magnetic field toward magnetic memory element (43).

7 Claims, 5 Drawing Sheets

MAGNETIC RANDOM ACCESS MEMORY AND FABRICATING METHOD THEREOF

"The present application is A Division of based on prior U.S. application Ser. No. 09/144,686, filed on Aug. 31, 1998, now U.S. Pat. No. 5,940,319 which is hereby incorporated by reference, and priority thereto for common subject matter is hereby claimed."

FIELD OF THE INVENTION

The present invention relates to a magnetic random access memory (MRAM) and a fabricating method thereof, and more particularly, to an MRAM device integrated with circuitry which is formed under a complementary metal oxide semiconductor (CMOS) process.

BACKGROUND OF THE INVENTION

A magnetic memory element has a structure which includes ferromagnetic layers separated by a non-magnetic layer. Information is stored as directions of magnetization vectors in magnetic layers. Magnetic vectors in one magnetic layer, for instance, are magnetically fixed or pinned, while the magnetization direction of the other magnetic layer is free to switch between the same and opposite directions as information which are called "Parallel" and "Antiparallel" states, respectively. In response to Parallel and Antiparallel states, the magnetic memory element represents two different resistances. The resistance indicates minimum and maximum values when the magnetization vectors of two magnetic layers point in substantially the same and opposite directions, respectively. Accordingly, a detection of changes in resistance allows an MRAM device to provide information stored in the magnetic memory element.

An MRAM device integrates magnetic memory elements and other circuits, for example, a control circuit for magnetic memory elements, comparators for detecting states in a magnetic memory element, input/output circuits, etc. These circuits are fabricated in the process of CMOS technology in order to lower the power consumption of the MRAM device. The CMOS process requires high temperature steps which exceeds 300° C. for depositing dielectric and metal layers and annealing implants, for example.

Magnetic layers employ ferromagnetic material such as CoFe and NiFeCo which requires processing below 300° C. in order to prevent intermixing of magnetic materials caused by high temperatures. Accordingly, magnetic memory elements need to be fabricated at a different stage after CMOS processing.

Magnetic memory elements contain components that are easily oxidized and also sensitive to corrosion. To protect magnetic memory elements from degradation and keep the performance and reliability of the MRAM device, a passivation layer is formed over magnetic memory elements.

In addition, a magnetic memory element includes very thin layers, some of them are tens of angstroms thick. The performance of the magnetic memory element is sensitive to the surface conditions on which magnetic layers are deposited. Accordingly, it is necessary to make a flat surface to prevent the characteristics of an MRAM device from degrading.

Metal lines are employed to produce magnetic fields for writing and/or reading states in a magnetic memory element. Less amount of current is desired to minimize power consumption.

Accordingly, it is a purpose of the present invention to provide an improved MRAM device which prevents a magnetic memory element from thermal degradation while fabricating the device.

It is another purpose of the present invention to provide an improved MRAM device which prevents a magnetic memory element from oxidation and corrosion.

It is a further purpose of the present invention to provide an improved MRAM device which reduces power consumption of the device.

It is a still further purpose of the present invention to provide a method of integrating an improved MRAM device into a CMOS process.

SUMMARY OF THE INVENTION

These needs and others are substantially met through provision of a magnetoresistive random access memory (MRAM) which includes magnetic memory elements on circuitry for controlling operations of magnetic memory elements. First, the circuitry is formed on a substrate under the CMOS process which requires a heat treatment of 300° C. or more. While fabricating the circuitry, conductive lines are also formed, which are used to create magnetic fields for writing and/or reading states in the magnetic memory element. The metal lines are enclosed by high permeability material such as a permalloy layer which facilitates magnetic fields to concentrate on the magnetic memory element. After completion of the circuitry, a surface of a layer including the circuitry is polished by the chemical mechanical polishing (CMP) process which produces a flat surface on the layer including the circuitry, then the magnetic memory element is formed thereon. The flat surface prevents the characteristics of the magnetic memory element from degrading. Fabrication of the magnetic memory element after the CMOS process improves the performance and reliability of the magnetic memory element and avoids thermal degradation of the magnetic memory element.

DETAILED DESCRIPTION OF THE PREFERRED EMBODIMENTS

FIGS. 1–13 illustrate cross-sectional views of sequential steps for fabrication of an MRAM device which includes transistors for switching magnetic memory elements in reading operations.

Figure 1:
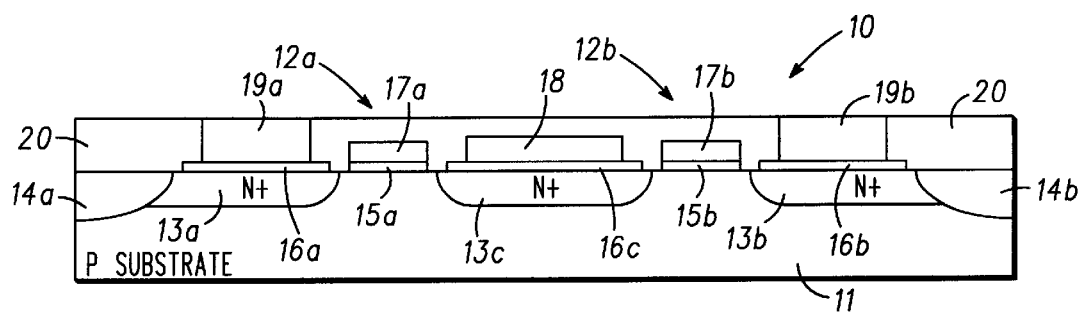
FIGS. 1–13 show cross-sectional views of sequential steps in the formation of an MRAM device.

Referring specifically to FIG. 1, a cross-sectional view of a partially fabricated magnetoresistive random access memory (MRAM) device 10 is illustrated, wherein device 10 includes a P-type silicon substrate 11. Device 10 has circuitry, for instance, NMOS switching transistors 12a and 12b which are fabricated by the well known CMOS process. Other circuit elements, for example, input/output circuit, data/address decoder, and comparators, may be contained in the MRAM device, however they are omitted from the drawings for simplicity.

First of all, substrate 11 is provided to pattern windows for N+ regions 13a, 13b and 13c and implant the source/drain regions 13a, 13b and 13c. Then isolation regions 14a and 14b are formed for separation. Next, poly-Si layers 15a and 15*b* are deposited on substrate 11 for forming gate regions. Metal layers 16*a* and 16*b* are deposited on N+ region 13*a* and 13*b* for source electrodes while metal layer 16*c* is deposited on N+ region 13*c* for a drain electrode. Further, metal layers 17*a* and 17*b* for gate electrodes are deposited on poly-Si layers 15*a* and 15*b*, respectively. A conductor line 18 is formed on metal layer 16*c*, which provides a sense current to magnetic memory elements through transistors 12*a* and 12*b*. A magnetic memory element will be explained hereinafter. Plug conductors 19*a* and 19*b*, which work for conducting a sense current to magnetic memory elements, are formed on and interconnected to metal layers 16*a* and 16*b*, respectively. All circuit elements of an MRAM device, except magnetic memory elements, digit lines and word lines, are integrated on substrate 11 before dielectric material 20 is filled. Then, A surface of device 10 is polished by the CMP (Chemical Mechanical Polishing) process which includes the top surface of dielectric layer 20 is flat.

Figure 2:
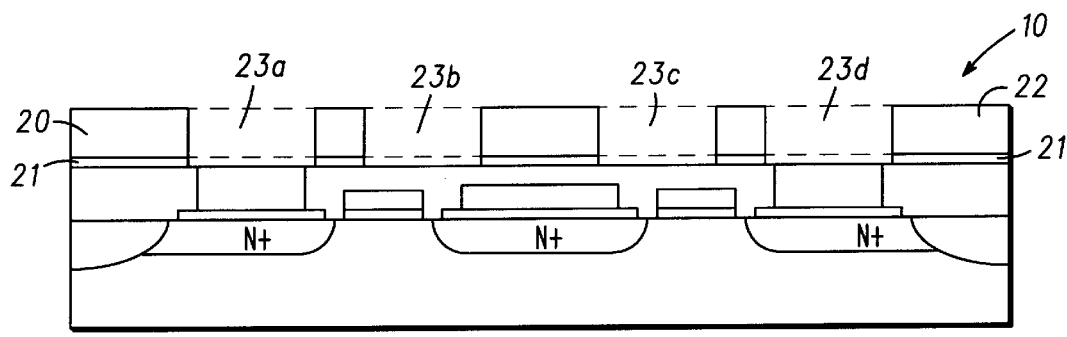

After partially fabricated MRAM device 10 has been completed, magnetic memory elements are formed on device 10 along with digit lines and word lines. As shown in FIG. 2, an etch stop layer 21, which employs material such as AlN, AlO and SiN, is deposited on the surface of device 10. Instead of etch stop layer 21, other technique such as endpoint etches may be used. A silicon dioxide layer 22 is deposited with a thickness of 4,000–6,000 Å on etch stop layer 21.

In the next step, a mask layer is deposited on silicon dioxide layer 22 and is patterned and defined as an etching mask using a standard lithography technique. As shown in FIG. 2, silicon dioxide 20 is etched away to etch stop layer 21 that makes trenches 23*a*–23*d* in silicon dioxide layer 22, and then the exposed etch stop layer is removed from trenches 23*a*–23*d*.

Figure 3:
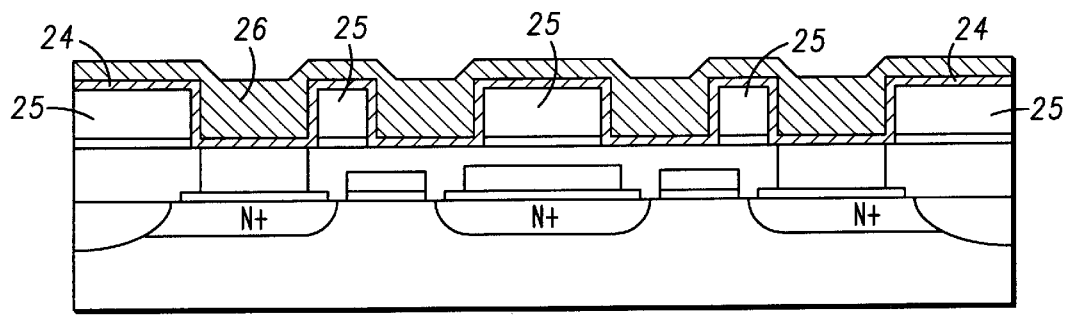
Figure 4:
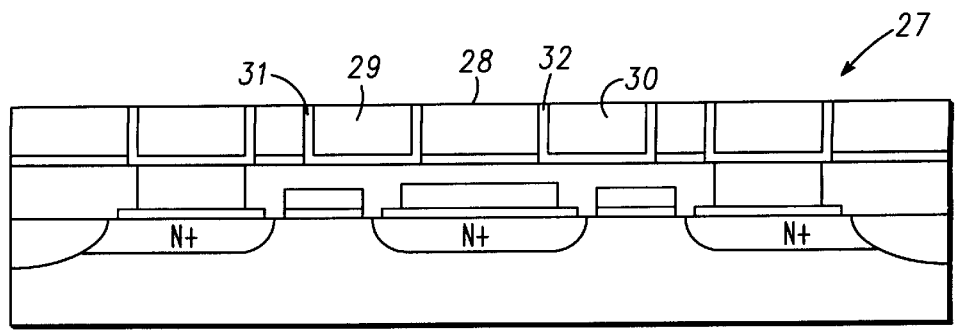

Referring to FIG. 3, a thin field focusing layer 24 having a high permeability such as nickel-iron is deposited overlying trenches 23*a*–23*d* and a silicon dioxide dielectric layer 25. High permeability layer 24 is 100–500 Å thick. In order to improve adhesion of field focusing layer 24 and to provide a barrier for Ni or Fe diffusion into dielectric layer of Ta or TaN or other such materials could be added between field focusing layer 24 and dielectric layer 25. A conductor metal layer 26 is then deposited on field focusing layer 24. As a conductor metal, aluminum, aluminum alloys, copper, and copper alloys are employed. In order to improve adhesion of field focusing layer 24 and to provide a barrier for Ni or Fe diffusion into the conductor and/or dielectric a layer of Ta or TaN or such materials could be added between field focusing layer 24 and conductor layer 26. After depositing metal layer 26, the metal bulged out of trenches 23*a*–23*d* and the high permeability layer 24 on silicon dioxide layer 25 is removed from a top surface by the CMP process so that, as shown in FIG. 4, a partially fabricated MRAM device 27 having a flat top surface 28 is produced.

Partially fabricated MRAM device 27 includes torque or digit lines 29 and 30 on which magnetic memory elements are formed. Digit lines 29 and 30 carry a current to generate a magnetic field which causes magnetic memory elements to store states. Digit lines 29 and 30 are enclosed by high permeability layers 31 and 32 excluding a portion on the top surface 28. Layer 31, for example, shields the magnetic field generated by current flowing in digit line 29 from magnetic flux leakage, and facilitates the magnetic field to focus on a magnetic memory element placed on digit line 29 through top surface 28 not covered by layer 31.

Figure 5:
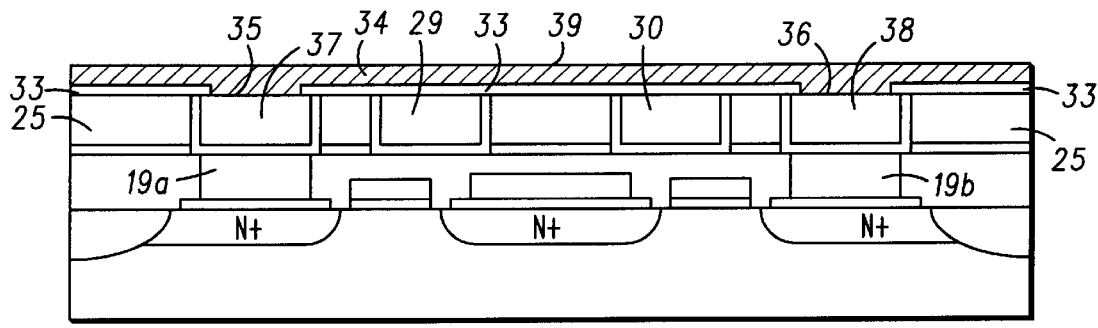

Referring to FIG. 5, a dielectric layer 33 is deposited over digit lines 29 and 30 and dielectric layer 25, and a conductor layer 34 is deposited over dielectric layer 33. Dielectric layer 33 is placed between digit lines 29 and 30 and conductor layer 34 to provide electrical isolation therebetween. Dielectric layer 33 is partially etched to make windows 35 and 36 on metal conductors 37 and 38 which are employed to electrically connect plug conductors 19*a* and 19*b* to conductor layer 34. After making windows 35 and 36, conductor layer 34 is deposited with a thickness of around 500 Å over dielectric layer 33 and metal conductors 37 and 38. In order to form magnetic memory elements on conductor layer 34, a top surface of conductor layer 34 needs to be smooth and flat because magnetic memory elements have very thin films, thereby a good condition for a magnetic memory element is attained. Surface 39 is polished and formed by a planarizing process such as CMP.

Figure 6:
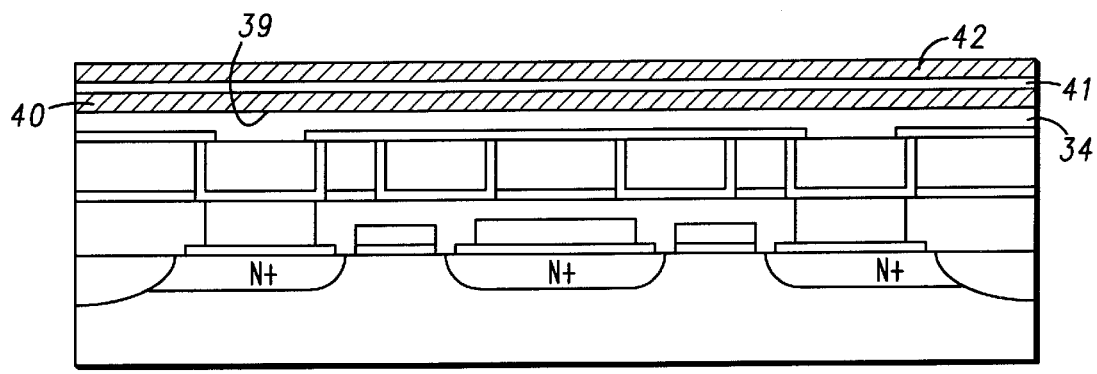

Next, as shown in FIG. 6, layers 40–42 for magnetic memory elements are deposited by either plasma vapor deposition (PVD) or ion beam deposition (IBD) techniques on surface 39 of conductor layer 34. Bottom and top magnetic layers 40 and 42 utilize magnetic material such as CoFe and NiFeCo while layer 41 employs a non-magnetic material such as $Al_2O_3$ or Cu. Bottom layer 40, for example, serves as a hard magnetic layer, magnetization in which is pinned or fixed, whereas magnetization directions in top magnetic layer 42 are free. Non-magnetic layer 41 is formed by the following methods. An aluminum film is deposited over bottom magnetic layer 40, then the aluminum film is oxidized by an oxidation source, such as RF oxygen plasma. As another method, aluminum is deposited together with oxide on layer 40, and then oxidation is carried out in oxygen ambient either heated or unheated. The layers in the magnetic memory element are very thin with magnetic layers varying from 20 to 200 Å and non-magnetic layer 41 from 10 to 30 Å.

Figure 7:
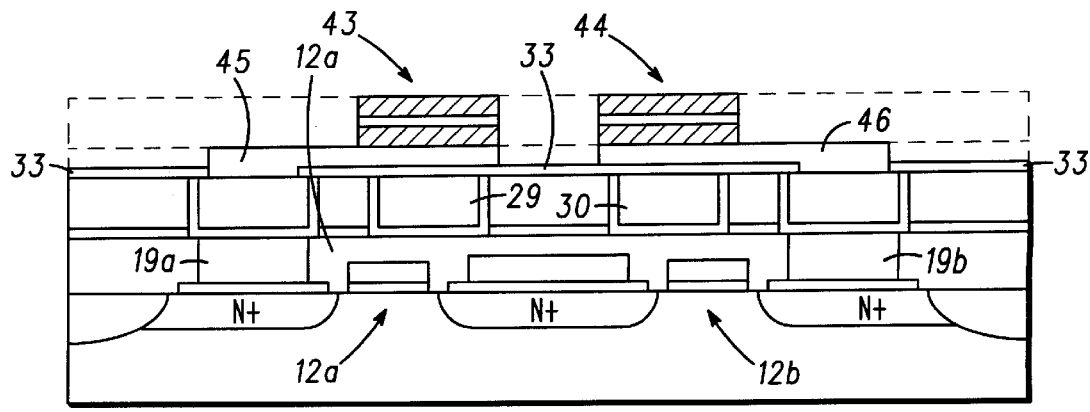

Layers 40–42 are patterned and etched down to conductor layer 34 so that, as shown in FIG. 7, magnetic memory elements 43 and 44 are formed on conductor layer 34. Furthermore, a mask pattern is formed on conductor layer 34 and etched down to dielectric layer 33 to make conductor lines 45 and 46 which electrically couple between magnetic memory element 43 and transistor 12*a* through plug conductor 19*a*, and magnetic memory element 44 and transistors 12*b* through plug conductor 19*b*, respectively. Conductor lines 45 and 46 are isolated from digit lines 29 and 30 by dielectric layer 33, respectively.

Figure 8:
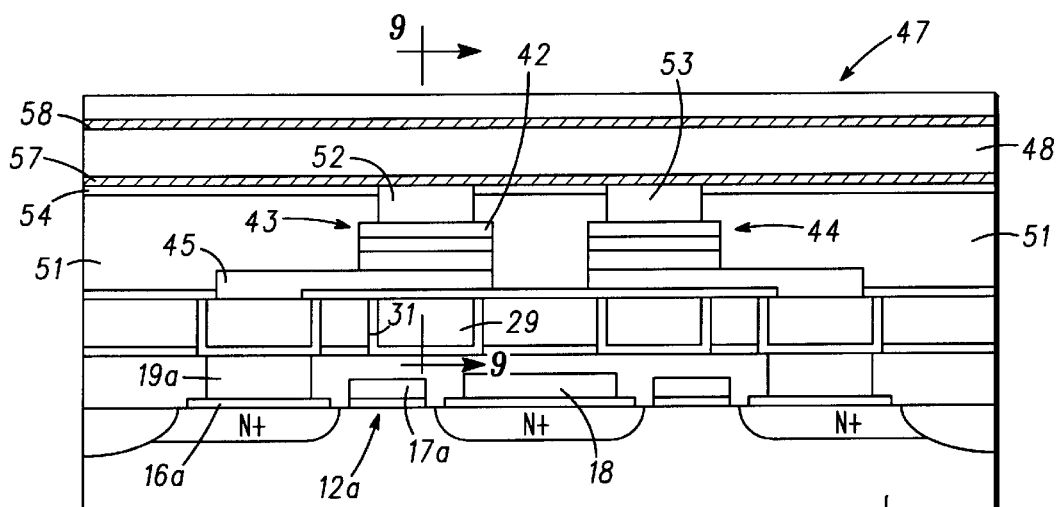
Figure 9:
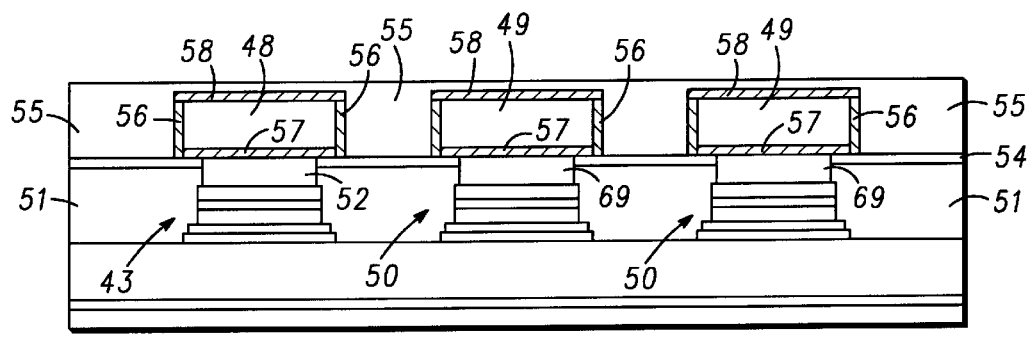

Referring to FIGS. 8 and 9, an enlarged cross-sectional view of an MRAM device 47 and a partial cross-sectional view through digit line 29, magnetic memory element 43, and a bit line 48 indicated by arrows 9—9 in FIG. 8 are illustrated. It should be noted that although three bit lines 48 and 49 and three magnetic memory elements 43 and 50 are shown in FIG. 9 for simplicity, more bit lines and magnetic memory elements are formed for MRAM device 47.

Referring to FIG. 8 again, after the etching of layers 40–42 and conductor layer 34 has been completed in order to form magnetic memory elements 43 and 44 as shown in FIG. 7, dielectric layer 51 is deposited overlying magnetic memory elements 43 and 44. Then, dielectric layer 51 on magnetic memory elements 43 and 44 is etched to define holes to magnetic memory elements 43 and 44, and conductive material is deposited in the holes to form conductive lines 52 and 53. Next, an etch stop layer 54 is deposited on dielectric layer 51 and, further, a dielectric layer 55 in FIG. 9 is deposited on etch stop layer 54. Next, a mask is patterned on dielectric layer 55 to form trenches for bit lines 48 and 49.

According to the mask, as shown in FIG. 9, dielectric layer 55 is etched down to etch stop layer 54 to make the trenches for bit lines 48 and 49. Next, a permalloy layer 56 is deposited over dielectric layer 55 and in the trenches. The permalloy layer is etched by an anisotropic etching which leaves only a permalloy layer 56 on the sidewalls of the trenches and removes the permalloy layer on dielectric layer 55 and the bottom of the trenches. After forming permalloy layer 56, a layer 57, which is electrically conductive, is deposited on the surface of conductive lines 52 and 69, and a metal such as Al, W, and Cu is filled in the trench for forming bit lines 48 and 49. Next, unnecessary material on dielectric layer 55 is removed and the surface of dielectric layer 55 and bit lines 48 and 49 is polished to a flat surface. Finally, a permalloy layer 58 is deposited and patterned on dielectric layer 55 and bit lines 48 and 49. Permalloy layers 56 and 58 enclose bit line 48, by which a magnetic field generated by a bit current in bit line 48 is concentrated toward magnetic memory element 43 and shielded to protect information in other magnetic memory elements.

Referring to FIG. 8 again, reading and writing operations of the MRAM device are briefly discussed hereinafter. Assume that magnetic memory element 43 is selected, for example. In a reading operation, a turn-on signal is applied to gate electrode 17a to turn on transistor 12a which allows a sense current to flow from drain electrode 18 through metal layer 16a, plug conductor 19a, conductor line 45 and magnetic memory element 43, to bit line 48. The sense current produces a voltage drop over magnetic memory element 43 which determines states stored in magnetic memory element 43. That is, the voltage drop is provided to voltage comparators (not shown) which compare with reference voltages to give states stored in magnetic memory element 43.

In order to write states in magnetic memory element 43, for example, bit and digit currents, which are provided to bit line 48 and digit line 29, generate magnetic fields, respectively. The magnetic field generated by the digit current is superimposed on the magnetic field generated by the bit current so that the total magnetic field is applied to write states in magnetic memory element 43. Directions of combined magnetic fields determine magnetization directions in free magnetic layer 42, thereby magnetic memory element 43 memorizes states or information. Digit line 29 is enclosed by permalloy layer 31 while bit line 48 is enclosed by permalloy layer 56 and 58. Permalloy layers 31, 56 and 58 facilitate magnetic fields generated by digit and bit currents to focus on magnetic memory element 43. Accordingly, less current is required to write and sense states in the magnetic memory elements.

Figure 10:
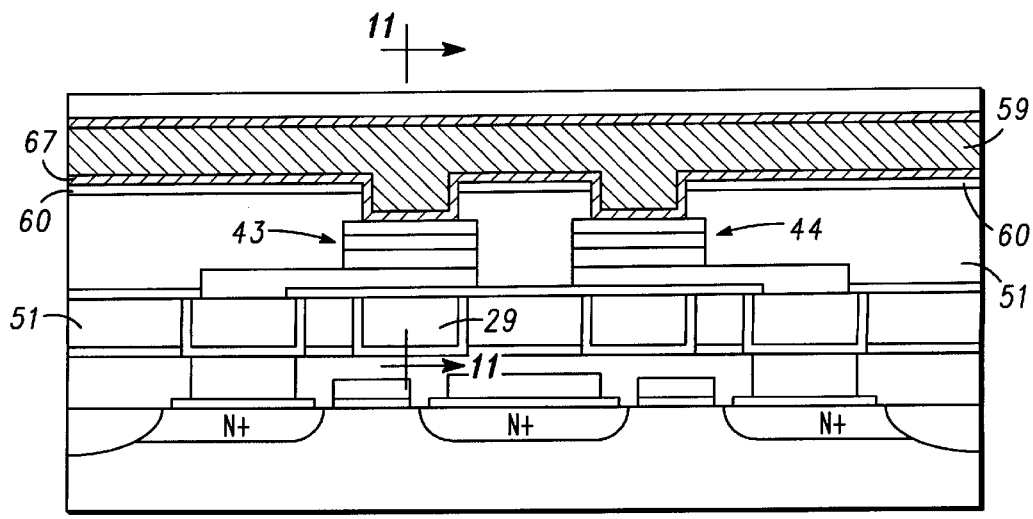
Figure 11:
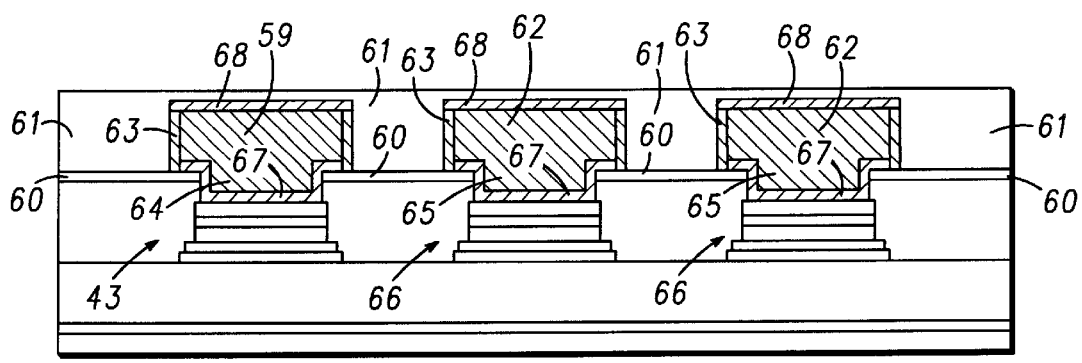

Another embodiment for forming a bit line is illustrated in FIGS. 10 and 11. FIG. 11 is a partial cross-sectional view through digit line 29, magnetic memory element 43, and a bit line 59 indicated by arrows 11—11 in FIG. 10. After the formation shown in FIG. 7 has been completed, as shown in FIG. 10, a dielectric layer 51 is deposited overlying magnetic memory elements 43 and 44 and the top surface of the dielectric layer 51 is polished. Then an etch stop layer 60 and a dielectric layer 61 on the surface of etch stop layer 60 are deposited sequentially. A mask is deposited and patterned on the dielectric layer 61 to form trenches for bit lines 59 and 62 in FIG. 11.

Next, referring to FIG. 11, dielectric layer 61 is etched until etch stop layer 60 according to the mask so that trenches are formed for bit lines 59 and 62. Then, a permalloy layer is deposited on dielectric layer 61 and in the trenches. The permalloy layer is patterned and etched by an anisotropic etching which leaves only a permalloy layer 63 on the sidewalls of the trenches. Further, the bottom of the trench is etched down until the top surface of magnetic memory elements 43 and 66 to form concave portions 64 and 65 which connect magnetic memory element 43 to bit line 60 and magnetic memory elements 66 to bit line 62, respectively. The bottom surface of the trench is deposited with a layer 67 such as Ta, TaN, or TiN, etc. which electrically connects between magnetic memory elements 43 and 66 and bit lines 59 and 62, respectively. A conductive material such as Cu is plated and filled in concave portions 63 and 64 and the trenches which form bit lines 59 and 62. The top surface of bit lines 59 and 62 and dielectric layer 59 are then polished and a permalloy layer 68 is deposited and patterned thereon. Bit line 59, for example, is enclosed by permalloy layers 63 and 68 which facilitate a magnetic field generated by a bit current in bit line 59 to focus on magnetic memory elements 43. The reading and writing operations are carried out by the same steps as mentioned earlier.

Figure 12:
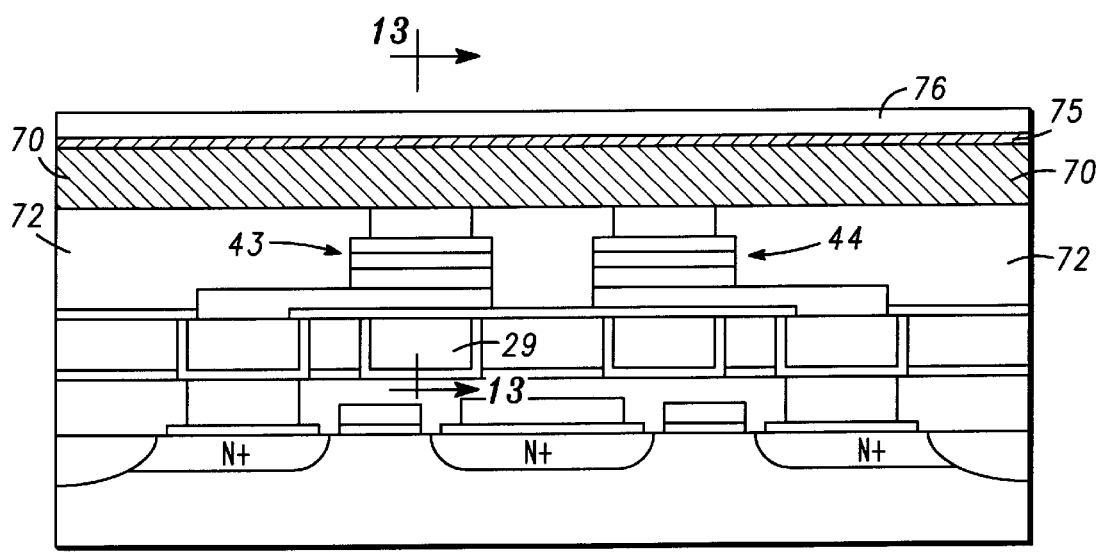
Figure 13:
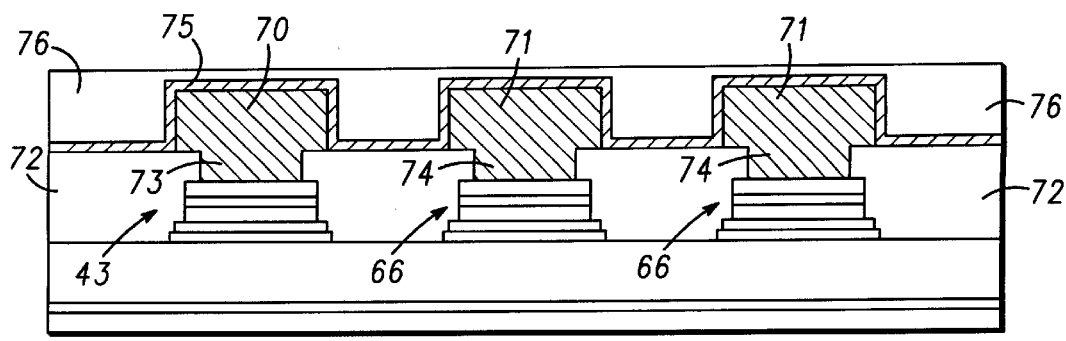

FIGS. 12 and 13 further illustrate another embodiment for forming bit lines 70 and 71. FIG. 13 is a partial cross-sectional view through digit line 29, magnetic memory element 43, and a bit line 70 indicated by arrows 13—13 in FIG. 12. After magnetic memory elements 43 and 44 are formed as shown in FIG. 7, a dielectric layer 72 is deposited overlying elements 43 and 44, and patterned and etched down to a top surface of elements 43 and 44 for making trenches 73 and 74. Next, metal material such as Al and Cu is filled in trenches 73 and 74 to form bit lines 70 and 71. The dielectric layer overlying bit line 73 and 74 is removed and a field focusing layer 75 such as NiFe is deposited on bit line 73 and 74 and dielectric layer 72. Then a dielectric layer 76 is deposited on field focusing layer 75.

Figure 14:
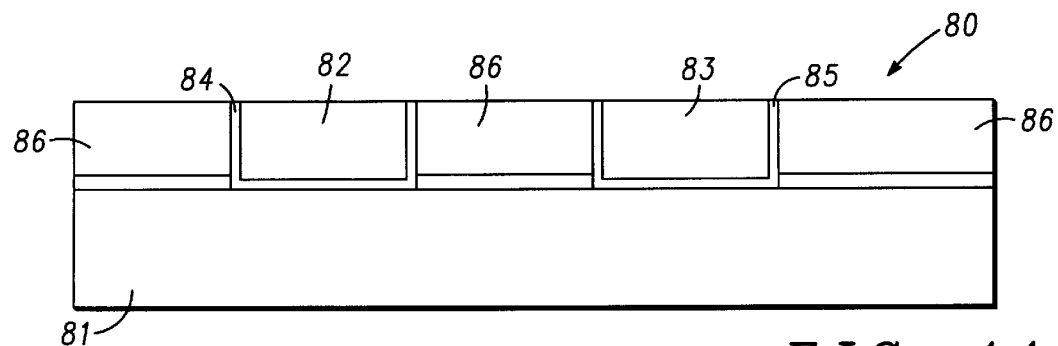
FIGS. 14–17 show cross-sectional views of sequential steps in the formation of another embodiment of an MRAM device.
Figure 15:
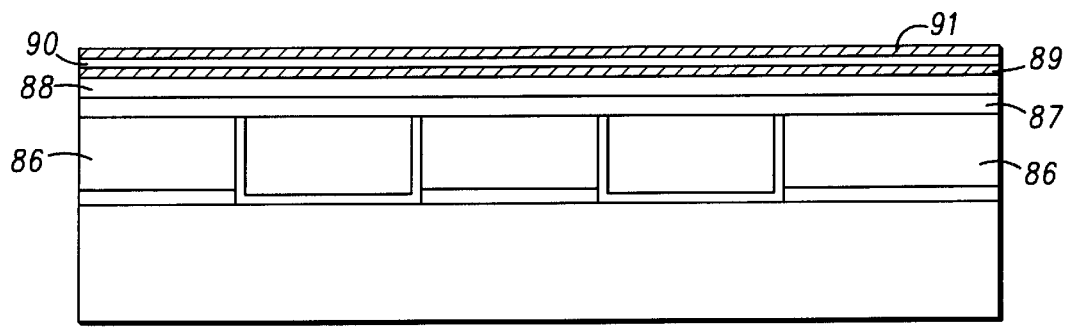
Figure 16:
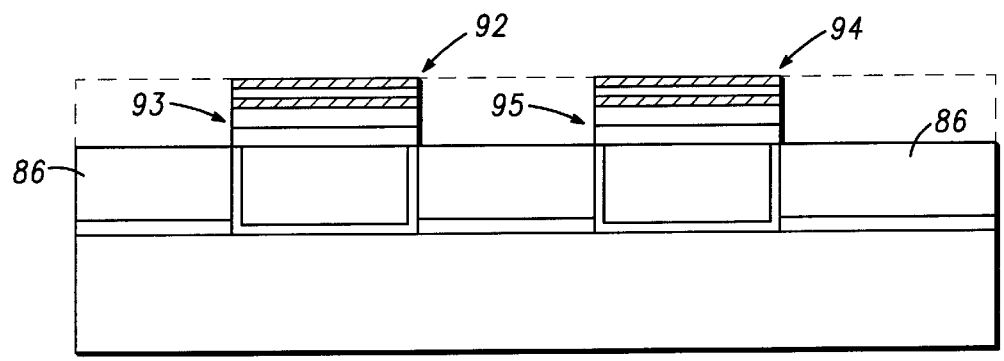

FIGS. 14–17 illustrate cross-sectional views of sequential steps in the formation of another embodiment of an MRAM device which includes diodes for switching a magnetic memory element to read information in the magnetic memory element. A cross-sectional view in FIG. 14 shows a partially fabricated MRAM device 80 which includes a substrate 81 having CMOS circuitry (not shown), and digit lines 82 and 83 enclosed by permalloy layers 84 and 85, respectively. This structure corresponds to digit lines 29 and 30 and permalloy layers 31 and 32 in FIG. 4. Accordingly, the same steps are carried out to produce the formation of digit lines 82 and 83 and permalloy layer 84 and 85. After depositing dielectric layer 86 overlying digit lines 82 and 83, the top surface of dielectric layer 86 is polished by the CMP process. Referring to FIG. 15, several layers for diodes and magnetic memory elements are deposited on polished dielectric layer 86. First of all, a couple of diode layers 87 and 88 are formed for a diode, for example, pn junction diodes or Schottky barrier diode. Next, magnetic layers 89, nonmagnetic layer 90 and magnetic layer 91 are sequentially deposited on layer 88, which forms the same layers 89–91 as layers 40–41 in FIG. 6. A mask (not shown) is then deposited and patterned on a top surface of layer 91. According to the mask, layers 89–91 and diode layers 87 and 88 are etched down to dielectric layer 86. As shown in FIG. 14, the etching forms magnetic memory element 92 on diode 93, and magnetic memory element 94 on diode 95.

Figure 17:
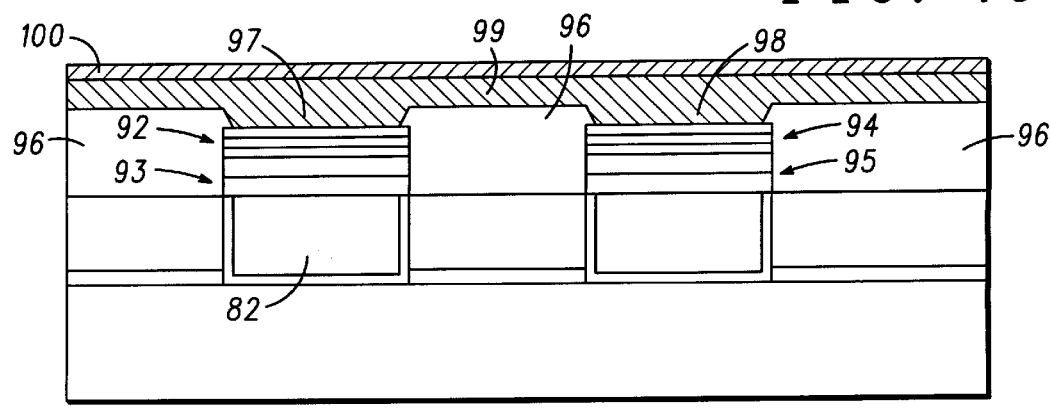

Referring to FIG. 17, a final formation of MRAM device employing a diode connection is illustrated. After the etching of layers 89–91 and diode layers 87 and 88, dielectric layer 96 is deposited overlying magnetic memory elements 92 and 94 and diodes 93 and 95. A mask is then deposited on dielectric layer 96 to selectively open windows 97 and 98 which are used to communicate top surfaces of magnetic memory elements 92 and 94 to a bit line 99. Bit line 99 such as Al and Cu is deposited on dielectric layer 96 and magnetic memory elements 92 and 94. Further, a permalloy layer 100 is deposited and patterned on bit line 99 to shield a magnetic field generated by a bit current in bit line 99 and focus it on magnetic memory elements 92 and 94.

In a reading operation to magnetic memory element 92, for example, a sense current is applied to magnetic memory element 92 through diode 93 from digit line 82. A voltage drop over magnetic memory element 92 is produced according to the states, which is sensed and compared to a reference voltage by a comparator (not shown) for the two possible states of magnetic memory element.

In a write operation, a bit current and a digit current is provided to bit line 97 and digit line 82, respectively. A combination magnetic field produced by bit and digit currents is applied to magnetic memory element 92. Magnetization directions of the combination field determines states to be stored in magnetic memory element 92.

In FIG. 17, permalloy layer 100 covers only the top surface of bit line 99. It should be appreciated that bit line 99 and permalloy layer 100 may be replaced by a bit line enclosed by a permalloy layer as shown in FIGS. 9 and 11.

Thus, an MRAM device with an improved and novel configuration and its fabrication method are disclosed in which circuitry for controlling magnetic memory element is fabricated first under the CMOS process and then the magnetic memory elements are fabricated. Accordingly, magnetic memory elements are integrated with circuit elements fabricated by a CMOS process and are prevented from degradation of metal composition caused by high temperatures. Further, because digit and bit lines are enclosed by a permalloy layer, magnetic fields generated by digit and bit currents are shielded and focused on magnetic memory elements, and less current is required.

What is claimed is:

1. A method of fabricating a random access memory having a magnetic memory cell and circuitry for controlling operations of the magnetic memory cell, the method comprising the steps of:
    providing a substrate on which the magnetic memory cell and the circuitry are formed;
    forming the circuitry on the substrate comprising steps of:
        forming a current control element for controlling a sense current supplied to the magnetic memory cell, and
        forming a first electrically conductive line;
    forming the magnetic memory cell on the circuitry being electrically isolated from the first electrically conductive line; and
    forming a second electrically conductive line being electrically coupled to the magnetic memory cell and being perpendicularly placed to the first electrically conductive line on the magnetic memory cell.

2. The method of fabricating a random access memory as claimed in claim 1 wherein the step of forming the magnetic memory cell further includes steps of:
    depositing a bottom metal layer overlying the circuitry;
    polishing a surface of the bottom metal layer to level by a chemical mechanical polishing (CMP) process;
    depositing a first magnetic layer, a non-magnetic layer, and a second magnetic layer;
    patterning a mask for the magnetic memory cell; and
    etching first, non-magnetic, second, and bottom metal layers to produce the magnetic memory cell.

3. The method of fabricating a random access memory as claimed in claim 1 wherein the step of forming the first electrically conductive line further includes steps of:
    depositing a dielectric layer on the substrate;
    patterning a mask for the first electrically conductive line;
    etching the dielectric layer to form a trench for the first electrically conductive line;
    depositing a high permeability material;
    depositing an electrically conductive material on the high permeability material; and
    removing the high permeability material and the electrically conductive material on the dielectric layer.

4. The method of fabricating a random access memory as claimed in claim 1 wherein the step of forming the second electrically conductive line further includes steps of:
    depositing a dielectric layer overlying the magnetic memory cell;
    patterning a mask for the second electrically conductive line;
    etching the dielectric layer to a top surface of the magnetic memory cell to form a trench for the second electrically conductive line;
    depositing electrically conductive material in the trench; and
    depositing a high permeability material overlying the second electrically conductive line.

5. The method of fabricating a random access memory as claimed in claim 1 further including a step of coating a high permeability layer overlying the second electrically conductive line.

6. The method of fabricating a random access memory as claimed in claim 1 wherein the step of forming the circuitry further includes a step of forming the circuitry by a complimentary metal oxide semiconductor (CMOS) process.

7. A method of fabricating a random access memory having a magnetic memory cell and circuitry for controlling operations of the magnetic memory cell, the method comprising the steps of:
    providing a substrate on which the magnetic memory cell and the circuitry are arranged;
    forming a first electrically conductive line comprising steps of;
    depositing a dielectric layer on the substrate;
    patterning a mask for the first electrically conductive line;
    etching the dielectric layer;
    depositing a high permeability material;
    depositing an electrically conductive material on the high permeability material; and
    polishing a top surface to flat and to remove the high permeability material and the electrically conductive material on the electrically conductive material;
    depositing a layer for a current control element overlying the first electrically conductive line;
    depositing a magnetic memory cell layer including a first magnetic layer, a non-magnetic layer, and a second magnetic layer;
    patterning a mask for the magnetic memory cell; and
    etching the magnetic memory cell layer and the layer for the current control element to produce the current control element and the magnetic memory cell; and
    forming a second electrically conductive line being electrically coupled to the magnetic memory cell and being perpendicularly placed to the first electrically conductive line on the magnetic memory cell.

* * * * *

UNITED STATES PATENT AND TRADEMARK OFFICE
CERTIFICATE OF CORRECTION

PATENT NO.    : 6,174,737 B1
DATED         : January 16, 2001
INVENTOR(S)   : Durlam et al.

It is certified that error appears in the above-identified patent and that said Letters Patent is hereby corrected as shown below:

<u>Column 1,</u>
Line 3, after the Title, please add as a new first paragraph the following paragraph:
-- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*